United States Patent [19]
Kajimura et al.

[11] Patent Number: 4,630,279
[45] Date of Patent: Dec. 16, 1986

[54] BURIED HETEROJUNCTION LASER

[75] Inventors: Takashi Kajimura, Hachioji; Takao Kuroda, Kokubunji; Yasutoshi Kashiwada, Nishitama; Naoki Chinone, Hachioji; Kunio Aiki, Takasaki, all of Japan

[73] Assignee: Hitachi, Ltd., Tokyo, Japan

[21] Appl. No.: 462,908

[22] Filed: Feb. 1, 1983

[30] Foreign Application Priority Data

Feb. 3, 1982 [JP] Japan ................................ 57-14986

[51] Int. Cl.$^4$ .............................................. H01S 3/19
[52] U.S. Cl. ...................................... 372/45; 357/17; 372/48
[58] Field of Search ...................... 372/44, 45, 46, 48; 357/17

[56] References Cited

U.S. PATENT DOCUMENTS 3,978,428 8/1976 Burnham et al. ...................... 372/48
4,321,556 3/1982 Sakuma .................................. 372/45
4,404,678 9/1983 Aiki et al. .............................. 372/45

FOREIGN PATENT DOCUMENTS 0152879 12/1979 Japan ..................................... 372/46

OTHER PUBLICATIONS

Aiki et al., "Transverse Mode Stabilized $Al_xGa_{1-x}As$ Injection Lasers with Channeled-Substrate-Planar-Structure" IEEE SQE vol. QE-14 No. 2 Feb. 1978, pp. 89-94.

Primary Examiner—James W. Davie
Attorney, Agent, or Firm—Antonelli, Terry & Wands

[57] ABSTRACT

Disclosed herein is a semiconductor laser device including at least an optical confinement region having at least first, second and third semiconductor layers disposed on a semiconductor substrate, wherein the first and third semiconductor layers have refractive indices greater than the refractive index of the second semiconductor layer but have forebidden band gap smaller than that of the second semiconductor layer and the conductivity types of the first and third semiconductor layers are opposite to each other; the second semiconductor layer has a smooth change of its thickness in two directions parallel to a junction surface of the optical confinement region; and a difference exists in the refractive indices of the first and third semiconductor layers.

19 Claims, 7 Drawing Figures

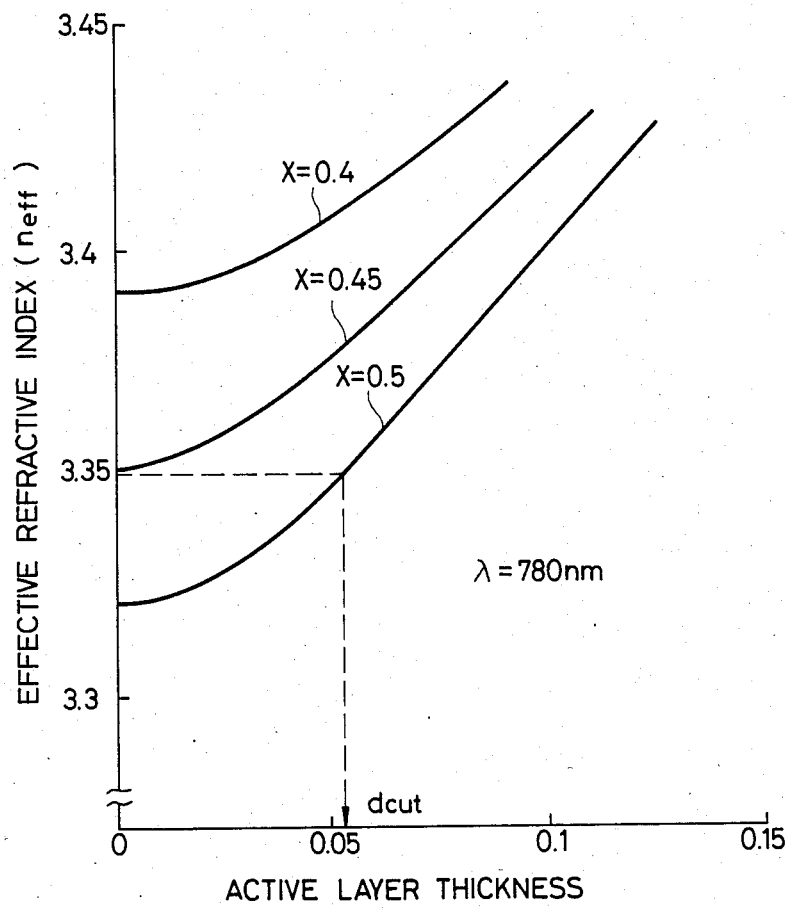

BURIED HETEROJUNCTION LASER

BACKGROUND OF THE INVENTION

FIELD OF THE INVENTION

This invention relates to a semiconductor laser device and more particularly, to a double-hetero structure laser having a structure in which an active layer is curved.

Transverse mode control of semiconductor laser is indispensable for putting the laser into practical application and a wide variety of device structures have been proposed in the past to realize this control. One of these proposals includes a structure in which an active layer is curved. This structure is formed by forming a double-hetero structure on a semiconductor substrate having a V-shaped or trapezoid groove in such a fashion that the active layer is curved. In this case, the thickness of the active layer reaches the maximum at the center of the groove and progressively decreases to the periphery due to a liquid phase epitaxial growth mechanism. Accordingly, the effective refractive index of the active layer becomes maximal at the center and progressively decreases towards the periphery and causes the difference in the effective refractive indices in directions parallel to the junction, thus making it possible to stabilize the laser transverse mode. (See: Articles to be announced at the No. 28th meeting of Society of Applied Physics; p 182, (1981), and articles to be announced at the No. 42nd meeting of Society of Applied Physics; p 171 (1981)). U.S. Pat. No. 3,978,428, for example, discloses semiconductor lasers having such a structure.

However, we have found a problem that in accordance with the structure described above as an example of the prior art, the difference in the effective refractive indices becomes too great between a light emitting region and regions outside the former and hence, a higher order transverse mode is likely to occur even at a low optical output.

SUMMARY OF THE INVENTION

It is therefore an object of the present invention to provide a semiconductor laser device which can be oscillated in a stable fundamental transverse mode and which has long service life as well as high reliability.

The fundamental construction of the present invention is as follows. In a semiconductor laser device including at least an optical confinement region which is disposed on a semiconductor substrate and which has at least first, second and third semiconductor layers, the semiconductor laser device in accordance with the present invention has a construction in which the refractive indices of the first and third semiconductor layers are smaller than that of the second semiconductor layer, and their band gap are wider than that of the second semiconductor layer; the first and third semiconductor layers have conductivity types opposite each other; the second semiconductor layer has a smooth change in the thickness thereof in direction parallel to the junction surface inside the optical confinement region; and there is a difference in the refractive indicies of the first and third semiconductor layers.

In other words, the present invention constitutes the difference in the refractive index between two cladding layers interposing the active layer of a semiconductor laser device of the type in which the thickness of the active layer changes smoothly, in order to obtain the stable fundamental transverse mode operation at a high optical output. If the refractive indices of the confinement layer are asymmetric, the light in the active layer is no longer guided when the active layer becomes thinner than a certain value (which is referred to as "cutoff"). (Hereinafter, the selection of the refractive indices of the cladding layers will be referred to as the "asymmetric state" and the selection of the refractive indices of the two cladding layers to an equal value will be referred to as the "symmetric state" of the refractive indicies.) In those lasers whose active layer is curved, the thickness of the active layer becomes maximal at the center of the groove and progressively decreases towards its periphery. It is therefore possible to transmit the light in the proximity of the groove center but to cut off the light in the peripheral portions by making the refractive indices of the confinement layer assymetric. The difference of the refractive indices is preferably from 0.015 to 0.08.

The same effect can be obtained when the active layer is curved on the side of the semiconductor substrate or to the opposite side. It is more preferred to increase the refractive index of the semiconductor layer having an p-type conductivity among the refractive indices of the two cladding layers. This is desirable in conjunction with the temperature characteristics of the semiconductor laser device. The reasons in detail will be described elsewhere.

BRIEF DESCRIPTION OF THE DRAWINGS

FIG. 4 is a diagram showing the relation between the thickness of the active layer and the effective refractive index ($n_{eff}$);

Hereinafter, the present invention will be described in further detail with reference to embodiments thereof.

DESCRIPTION OF THE PREFERRED EMBODIMENTS

Figure 1:
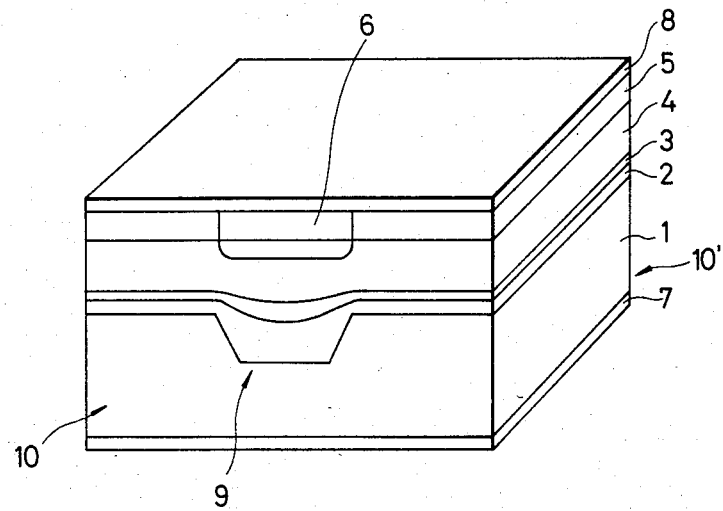
FIG. 1 is a perspective view of the semiconductor laser device in accordance with the present invention.

FIG. 1 is a perspective view showing the semiconductor laser device in accordance with an embodiment of the present invention. In the drawing, reference numerals 10, 10' represent the plane perpendicular to the travelling direction of the laser light. A photoresist film having a 3 to 10 μm-wide window is formed on the (100) plane of an n-type GaAs substrate 1 (Te deped, n~1×10$^{18}$ cm$^{-3}$) by ordinary photoresist techniques. Chemical etching is then carried out through this window so as to define a recessed groove 9 having a width of 3 to 10 μm and a depth of 1 to 5 μm. After the photoresist film is removed, an n-Ga$_{1-y}$Al$_y$As cladding layer 2 (0.3≦y≦07; e.g., y=0.45), a Ga$_{1-x}$Al$_x$As active layer 3 (0≦x≦0.35; e.g., x=0.14), a p-Ga$_{1-z}$Al$_z$As cladding layer 4 (0.3≦z≦0.7; e.g., z=0.5) and an n-GaAs cap layer 5 are formed by known liquid epitaxial growth. In this case, the layers 4 and 5 are 2 to 3 μm thick and 1 μm thick, respectively. The thickness of the layer 2 is selected so that the active layer to be formed thereon is curved within a range of 0.2 to 1 μm at the groove center with respect to the groove shoulder. Due to the liquid phase epitaxial growth mechanism, the thickness of the active layer becomes great at the center of the curve (sag).

Incidentally, in the structure in which the groove is defined on the substrate as shown in FIG. 1, the layers are set to the following ranges, respectively:
- groove depth: 0.5 to 2 μm
- groove width: 3 to 10 μm
- thickness of active layer at center: 0.03 to 0.1 μm
- thickness of active layer on substrate surface other than groove: 0.01 to 0.07 μm
- thickness of cladding layer between substrate surface other than groove and active layer: 0.1 to 1 μm
- thickness of cladding layer existing on active layer: 0.5 to 3 μm (The last-mentioned thickness is not greatly important.)

The difference in thickness on the active layer is from 0.01 to 0.09 μm. This is appropriately selected in consideration of the thickness of the active layer and the like.

In this embodiment, epitaxial growth is carried out so that the active layer at the center of the groove becomes 0.04 to 0.1 μm thick. Zn and Te are used as p- and n-type impurities to be added, respectively. Next, a mask for forming a current passage is formed also by the photoresist technique. Zn is then diffused through the window of this mask, thereby defining a p-type Zn diffusion region 6 to serve as the current passage. After the mask is removed, Au and Cr and Au-Ge-Ni are vacuum-evaporated to form p- and n-electrodes 8 and 7, respectively. Finally, cleavage is effected on the (110) plane 10, 10' so that the opposed surfaces become parallel to each other, completing a laser resonator. The cavity length of the laser is 300 μm.

The semiconductor laser device thus produced causes laser oscillation at room temperature and at an approximately 2 KA/cm$^2$ threshold current density. Its differential quantum efficiency is approximately 40%. A drastic improvement can be observed in the linearity of the current-vs-optical output characteristic, which is the most important characteristic of the semiconductor laser, in comparison with the case in which the AlAs composition of the cladding layers is symmetric.

Figure 2:
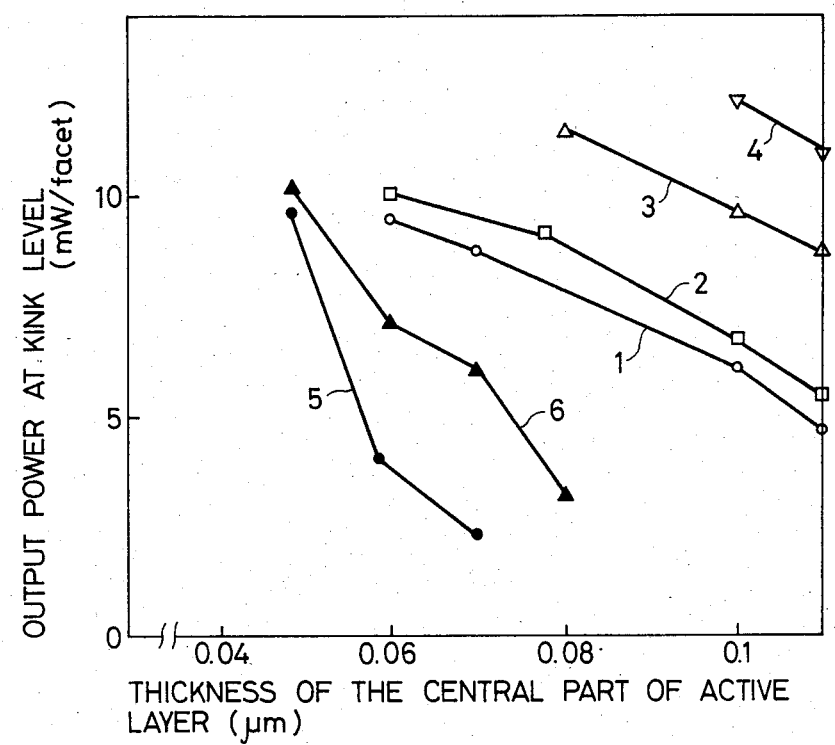
FIG. 2 is a diagram showing the relation between the thickness of the central part of the active layer and the output power at a kink level.

FIG. 2 shows the relation between the optical output at the time of occurrence of kink and the thickness of the active layer at the center when the AlAs compositions of the cladding layers are symmetric and asymmetric, respectively. Samples used in FIG. 1 are illustrated in Table 1. The composition of the active layer is $Ga_{0.86}Al_{0.14}As$ and the oscillation wavelength is 780 nm.

TABLE 1

| No. | z/y | $\|n^n - n^p\|$ | d act (μm) | $P_k$ (mW/facet) | $P_c$ (mW/facet) |
|---|---|---|---|---|---|
| 1 | 0.45/0.42 | 0.015 | 0.06 | 9.5 | 70 |
|   |   |   | 0.07 | 8.7 | 60 |
|   |   |   | 0.1 | 6.0 | 40 |
|   |   |   | 0.12 | 4.5 | 30 |
| 2 | 0.5/0.45 | 0.03 | 0.06 | 10 | 60 |
|   |   |   | 0.077 | 9 | 50 |
|   |   |   | 0.1 | 6.7 | 30 |
|   |   |   | 0.12 | 5.3 | 20 |
| 3 | 0.45/0.4 | 0.04 | 0.08 | 11.5 | 50 |
|   |   |   | 0.1 | 9.5 | 35 |
|   |   |   | 0.12 | 8.8 | 20 |
| 4 | 0.51/0.4 | 0.08 | 0.1 | 12 | 30 |
|   |   |   | 0.12 | 11 | 22 |
| 5* | 0.5/0.5 | 0 | 0.06 | 4 | — |
|   |   |   | 0.07 | 2.3 | — |
| 6* | 0.45/0.45 | 0 | 0.06 | 7 | — |
|   |   |   | 0.07 | 6 | — |
|   |   |   | 0.08 | 3 | — |

*comparative examples

In Table 1 above, z/y represents the AlAs mole fraction of each cladding layer and $|n^n - n^p|$ is the difference of refractive indices between the n-type cladding layer and the p-type cladding layer. The quantity $d_{act}$ represents the thickness of the active layer. Sample numbers correspond to those put to each curve of FIG. 2. Samples Nos. 5 and 6 are controls. $P_k$ and $P_c$ represent the characteristics of each sample; the former representing the optical output at the time of occurrence of kink and the latter, catastrophic power limit. Catastrophic degradation would occur if an optical output higher than above is to be obtained.

Figure 3:
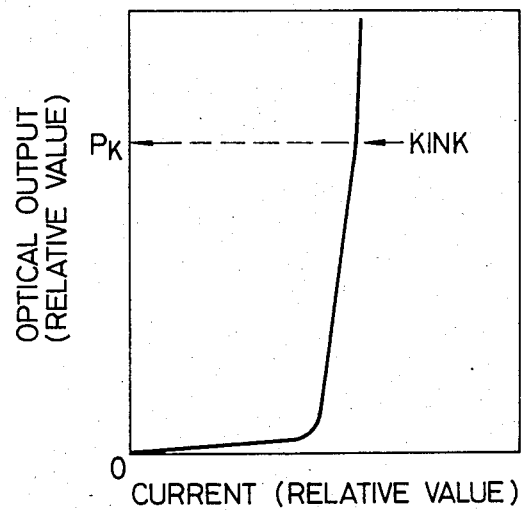
FIG. 3 is a diagram showing the occurrence of the kink on a current-vs.-optical output curve.

Incidentally, $P_k$ is determined by first obtaining the relation between the current and the optical output such as shown in FIG. 3 and then determining the optical output $P_k$ at the point where the linear relation can no longer be maintained between the current and the optical output and the kink develops.

Substantially the same results can be obtained for other compositions of the active layer.

If cases in which the cladding compositions are 0.45 and 0.5 and are symmetric and a case in which the n-type cladding layer composition is 0.45 and the p-type cladding layer composition is 0.5 and is asymmetric are compared with each other, for example, the kink occurrence optical output is found drastically decreasing in the device having the symmetric cladding compositions. This is because the difference of refractive indices becomes too large between the active layer and the cladding layers in the directions parallel to the hetero junction and the higher order transverse mode develops. In the device having the asymmetric cladding compositions on the other hand, the drop of the optical output at the time of occurrence of kink is not great. As will be explained in the following, this is because, if a laser device having a curved active layer has asymmetric cladding compositions, mode cut-off develops as the thickness of the active layer becomes progressively thinner from the center of curvature to the periphery so that the higher order transverse mode is not likely to occur.

FIG. 4 shows the relation between the thickness of the active layer and the effective refractive index of the GaAlAs semiconductor laser. The effective refractive index is calculated using a three-layered slab waveguide model having the symmetric cladding compositions. In this calculation, the oscillation wavelength of the device is 780 nm and the AlAs mole fraction x of the cladding layer is used as the parameter. The thickness ($d_{cut}$) of the active layer causing cut-off in a device having an asymmetric cladding composition can be seen from the drawing. In those devices whose cladding layer composition is 0.5 and the compositions of both cladding layers are symmetric, the effective refractive index becomes in agreement with a device whose cladding layer composition is 0.45 if the thickness of the active layer of the former drops down to approximately 0.052 μm. Accordingly, in those asymmetric devices whose cladding layer compositions are 0.45 and 0.5, the light generated inside the active layer leaks into the cladding layer having the AlAs composition of 0.45 if the active layer is approximately 0.052 μm thick or below and no light of the guiding mode exists any more. In those devices whose active layer is curved, the thickness of the active layer becomes thinner around its peripheral portions so that the mode cut-off condition is established in the proximity of the end portions of the active layer in the direction parallel to the junction in laser devices having the asymmetric cladding compositions. Accordingly, the higher order transverse mode requiring a broad oscillation region becomes difficult to sustain in the laser devices having the asymmetric cladding compositions and hence, a stable fundamental transverse mode operation can be obtained.

Referring to FIG. 2, samples as comparative examples are shown in which, too, $P_k$ reaches 10 mW/facet, but the active layer of each of these samples is extremely thin. In this case, the following problem occurs and hence, they can not be used as a practical product.

Figure 5:
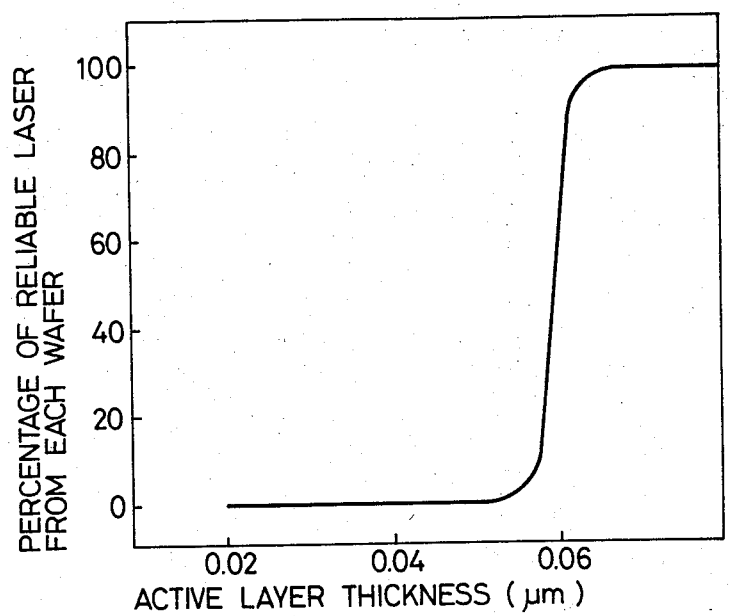
FIG. 5 is a diagram showing the relation between the thickness of the active layer and the percentage of reliable lasers from each wafer.

The threshold current density $J_{th}$ of a semiconductor laser device increases rapidly when the thickness of the active layer is drastically reduced because the light confinement ratio into the active layer drops. Accordingly, the carrier density (proportional to $J_{th}/d$) inside the active layer under the laser oscillation state increases drastically when the active layer becomes thinner, resulting primarily in the drop of the device reliability. FIG. 5 shows the relation between the percentage of reliable laser from each wafer and the thickness of the active layer. In the diagram, the frequency of occurrence of high reliable laser is plotted on the ordinate to illustrate its relation with the thickness of the active layer of a laser device which is defined as being "highly reliable" if the increase of the driving current remains within 10% of the initial value when the device is operated under the constant optical output condition of 70° C. and 5 mW for 1000 hours. It can be seen from the diagram that highly reliable devices can be hardly obtained if the thickness of the active layer is below 0.06 μm.

The result shown in FIG. 5 fundamentally depends upon the thickness of the active layer but not essentially upon the mixed crystal ratio and the like. When the device of this embodiment whose n- and p-type cladding layer compositions are asymmetric and 0.45 and 0.5, respectively, and whose active layer thickness is at least 0.06 μm is operated at an ambient temperature of 70° C. under the constant optical output condition in order to examine its reliability, any significant degradation can not be found even after the passage of $5\times10^3$ hours and the device is thus found having high reliability. When the similar reliability tests are carried out for devices having the symmetric cladding layer composition, drastic degradation is found proceeding to some extents when the active layer thickness is reduced down to 0.05 μm or below in order to increase the kink occurrence optical output. This results from the drop of reliability due to the increase in the carrier density inside the active layer.

Besides the embodiment described above, the active layer and the AlAs composition of the cladding layers are changed in GaAlAs layer devices to prepare asymmetric lasers and the effect thereby is confirmed. As a result, it is found that when the difference of the AlAs compositions of the cladding layers is set within the range of from 0.03 to 0.1, a satisfactory result can be obtained. This difference of the composition ratio corresponds to the difference of the refractive indices ranging from 0.015 to 0.08. If the composition difference is set below 0.03, the effect of asymmetry becomes small and if the thickness of the active layer is increased, multimode oscillation is likely to develop. On the other hand, if the composition difference is above 0.1, the mode cut-off thickness of the active layer is at least 0.1 μm so that control of the active layer thickness becomes difficult. If the active layer thickness is too great, catastrophic degradation is likely to occur. Hence, the active layer thickness is preferably up to 0.12 μm and more preferably, up to 0.1 μm.

It is also found that if a layer having a smaller AlAs mole fraction is used as the p-type cladding layer, the effective mass of the electron is small so that the carrier is likely to leak and the temperature characteristics of the device becomes inferior to those of a device in the reverse case (that is, the n-type cladding layer has a smaller AlAs mole fraction).

A part of the carriers injected into the active layer is thermally excited and starts flowing beyond the barrier of the hetero junction defined on the interface between the active layer and the cladding layers. This phenomenon is particularly remarkable at high temperatures. When the refractive indices of the two cladding layers are asymmetrically disposed, the phenomenon is more remarkable on the side of the cladding layer having the higher refractive index, that is, having a smaller forebidden band gap.

If the refractive index of the p-type cladding layer is increased (or if the forebidden band gap is decreased), the carrier outflow principally occurs on the side of the p-type cladding layer. In this case, the outflowing carrier is electrons which are the minority carriers. Since the effective mass of the electron is smaller than that of the hole, it is more likely to be thermally excited. For this reason, if the refractive index of the p-type cladding layer is made greater than that of the n-type cladding layer, the carrier outflow becomes greater and hence, the temperature characteristics of the laser device becomes more inferior.

The temperature dependence of the threshold current ($I_{th}$) can be generally expressed by the following equation:

$$I_{th}=I_{0exp}(T/T_o)$$

where
T: temperature
To: constant

Accordingly, the temperature stability of the devices can be compared by comparing their To's.

In the case in which z/y=0.45/0.42 and $d_{act}$=0.07, To is 120 to 180 (K) and when z/y=0.42/0.45 and $d_{act}$=0.07, To is 80 to 120 (K) (with the proviso that z represents the AlAs mole fraction of the p-type cladding layer and y does that of the n-type cladding layer).

Thus, the temperature characteristics can be more stabilized by reducing the AlAs mole fraction of the n-type cladding layer or by increasing its refractive index.

Although the foregoing deals with the GaAsGaAlAs system semiconductor laser devices by way of example, exactly the same effect of the present invention can also be obtained from laser devices using other materials such as semiconductor compounds of the Groups III–V of the Periodic Table.

For example, the present invention can be naturally applied to semiconductor laser devices of the InGaP system, the InGaAlP system, the InGaAsP system, the InAsSb system, the InGaSb system, and other semiconductor materials.

Furthermore, the present invention can be applied to semiconductor layer devices of the type in which the thickness of the active layer changes smoothly in two directions parallel to the junction surface of the confinement region, and definite means for realizing the shape of this active layer is not particularly limited to the foregoing. One of such means will be illustrated below by way of example.

Figure 6:
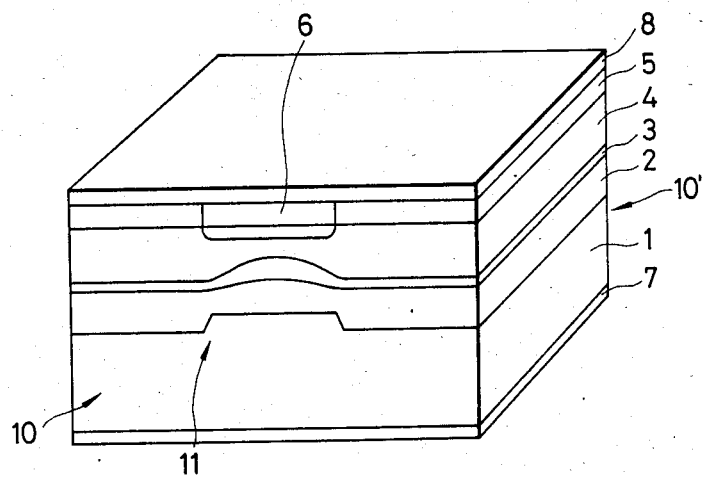
FIGS. 6 and 7 are perspective views of other embodiments of the present invention.
Figure 7:
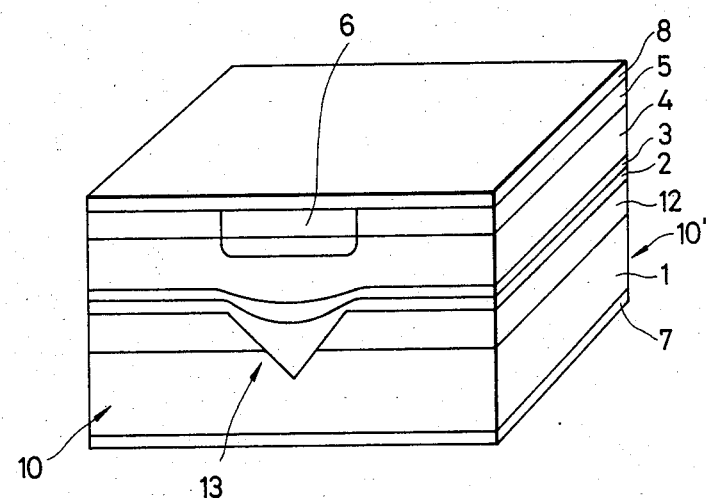

FIG. 6 shows a device structure in which the active layer 3 is curved in the opposite direction to the substrate 1. Each semiconductor layer is formed on a protuberance 11 formed on the substrate 1, by epitaxial growth. In FIG. 7, an epitaxial layer 12 having a conductivity type opposite to that of the substrate 1 is formed on the substrate 1 and a V-groove 13 is defined on both epitaxial layer 12 and substrate 1. Using the resulting V-groove, the active layer is curved.

Incidentally, like reference numerals are used in FIGS. 6 and 7 to identify like constituents as in FIG. 1. The epitaxial layer 12 is effective for contracting the current.

What is claimed is:

1. A semiconductor laser device comprising an optical confinement region having a center, a first cladding layer in surface contact with a first face of an active layer and a second cladding layer in surface contact with a second surface of the active layer which is opposed to the first surface, said layers being disposed on a semiconductor substrate, said first and second cladding layers having refractive indices smaller than the refractive index of said active layer and having forbidden bandgaps greater than the forbidden bandgap of said active layer, and the conductivity types of the first and second cladding layers being opposite each other, said active layer having a smooth change of thickness thereof in two directions parallel to a junction surface of said optical confinement region and the thickness of the active layer becoming a maximum substantially at the center of the optical confinement region, and said first and second cladding layers having different refractive indices.

2. The semiconductor laser device of claim 1 wherein the difference of refractive indices of said first and third semiconductor layers is within the range of from 0.015 to 0.08.

3. The semiconductor laser device of claim 1 or 2 wherein the refractive index of an n-type semiconductor layer of either of said first and third semiconductor layers is greater than that of the other.

4. The semiconductor laser device of claim 1 or 2 wherein said optical confinement region is formed on a semiconductor substrate having a groove extending in a direction parallel to the travelling direction of the laser light, and the thickness of said active layer smoothly changes within said groove.

5. The semiconductor laser device of claim 3 wherein said optical confinement region is formed on a semiconductor substrate having a groove extending in a direction parallel to the travelling direction of the laser light and the thickness of said second semiconductor layer smoothly changes within said groove.

6. The semiconductor laser device of claim 1 or 2 wherein said first, second and third semiconductor layers are made of semiconductor compounds chosen from the Groups III-V of the Periodic Table.

7. The semiconductor laser device of claim 3 wherein said first, second and third semiconductor layers are made of semiconductor compounds chosen the Groups III-V of the Periodic Table.

8. The semiconductor laser device of claim 6 wherein said first and third semiconductor layers are made of GaAlAs and said second semiconductor layer is made of GaAs or GaAlAs.

9. The semiconductor laser device of claim 7 wherein said first and third semiconductor layers are made of GaAlAs and said second semiconductor layer is made of GaAs or GaAlAs.

10. The semiconductor laser device of claim 8 wherein each of said first, second and third semiconductor layers is made of $Ga_{1-y}Al_yAs$, $Ga_{1-x}Al_xAs$ and $Ga_{1-z}Al_zAs$, where $0.3 \leq y \leq 0.7$, $0 \leq x \leq 0.35$, $0.3 \leq z \leq 0.7$ and $y \neq z$.

11. The semiconductor laser device of claim 10 wherein the difference between y and z is within the range of 0.03 to 0.1.

12. The semiconductor laser device of claim 10 wherein the values y and z in said semiconductor layers are smaller when said semiconductor layer is of the n-type than when the other is of the p-type, and the difference between them is within the range of 0.05 to 0.1.

13. The semiconductor laser device of claim 1 or 2 wherein said second semiconductor layer is curved in the direction opposite to said substrate and its thickness smoothly changes in two directions parallel to the junction surface in said optical confinement region.

14. The semiconductor laser device of claim 3 wherein said second semiconductor layer is curved in the direction opposite to said substrate and its thickness smoothly changes in two directions parallel to the junction surface in said optical confinement region.

15. The semiconductor laser device of claim 1 or 2 wherein said second semiconductor layer is curved towards said semiconductor substrate and its thickness smoothly changes in two directions parallel to the junction surface in said optical confinement region.

16. The semiconductor laser device of claim 3 wherein said second semiconductor layer is curved towards said semiconductor substrate and its thickness smoothly changes in two directions parallel to the junction surface in said optical confinement region.

17. The semiconductor laser device of claim 9 wherein each of said first, second and third semiconductor layers is made of $Ga_{1-y}Al_yAs$, $Ga_{1-x}Al_xAs$ and $Ga_{1-z}Al_zAs$, where $0.3 \leq y \leq 0.7$, $0 \leq x \leq 0.35$, $0.3 \leq z \leq 0.7$ and $y \neq z$.

18. The semiconductor laser device of claim 10 wherein the difference between y and z is within the range of 0.03 to 0.1.

19. The semiconductor laser device of claim 17 wherein the values y and z in said semiconductor layers are smaller when said semiconductor layer is of the n-type than when the other is of the p-type, and the difference between them is within the range of 0.5 to 0.1.

* * * * *